United States Patent [19]

Hashemi et al.

[11] Patent Number: 5,344,795
[45] Date of Patent: Sep. 6, 1994

[54] METHOD FOR ENCAPSULATING AN INTEGRATED CIRCUIT USING A REMOVABLE HEATSINK SUPPORT BLOCK

[75] Inventors: Seyed H. Hashemi; Michael A. Olla; Thomas P. Dolbear; Richard D. Nelson, all of Austin, Tex.

[73] Assignee: Microelectronics And Computer Technology Corporation, Austin, Tex.

[21] Appl. No.: 949,189

[22] Filed: Sep. 22, 1992

[51] Int. Cl.⁵ .................... H01L 21/56; H01L 21/58; H01L 21/60

[52] U.S. Cl. ................. 437/214; 437/902; 264/272.15; 264/272.17; 264/278

[58] Field of Search ............... 437/902, 214, 974; 257/796; 264/272.15, 272.17, 278, DIG. 44, 272.11

[56] References Cited

U.S. PATENT DOCUMENTS

| | | | |
|---|---|---|---|
| 3,579,056 | 5/1971 | Te Velde | 317/234 |
| 3,590,466 | 7/1971 | Moshammer et al. | 29/471.3 |
| 3,686,533 | 8/1972 | Garnier et al. | 317/100 |
| 3,836,825 | 9/1974 | Hall et al. | 257/796 |
| 4,009,752 | 3/1977 | Wilson | 165/81 |
| 4,136,442 | 1/1979 | Harnett | 29/629 |
| 4,242,157 | 12/1980 | Gehle | 156/64 |
| 4,244,098 | 1/1981 | Barcus | 29/596 |
| 4,333,102 | 6/1982 | Jester et al. | 357/81 |
| 4,356,864 | 11/1982 | Ariga et al. | 165/80 |
| 4,407,006 | 9/1983 | Holick et al. | 357/68 |
| 4,421,161 | 12/1983 | Romania et al. | 165/80 |
| 4,451,004 | 9/1985 | Moore | 357/81 |
| 4,465,130 | 8/1985 | Romania et al. | 165/185 |
| 4,530,152 | 7/1985 | Roche et al. | 437/974 |
| 4,593,456 | 6/1986 | Cheung | 148/135 |
| 4,598,308 | 7/1986 | James et al. | 357/81 |
| 4,611,238 | 9/1986 | Lewis et al. | 357/81 |
| 4,620,216 | 10/1986 | Horvarth | 357/81 |
| 4,624,302 | 11/1986 | Hayden et al. | 165/80.2 |
| 4,682,208 | 7/1987 | Ohashi et al. | 357/81 |
| 4,682,651 | 7/1987 | Gabuzda | 165/80.2 |
| 4,715,430 | 12/1987 | Arnold et al. | 165/80.3 |
| 4,721,996 | 1/1988 | Tustaniwskyj et al. | 357/82 |
| 4,730,666 | 3/1988 | Flint et al. | 165/80.4 |
| 4,750,031 | 6/1988 | Miller et al. | 357/81 |
| 4,868,349 | 9/1989 | Chia | 174/52.4 |
| 4,878,108 | 10/1989 | Phelps, Jr. et al. | 357/81 |
| 4,888,449 | 12/1989 | Crane et al. | 174/52.4 |
| 4,899,210 | 2/1990 | Lorenzetti et al. | 357/81 |
| 4,964,458 | 10/1990 | Flint et al. | 165/80.4 |
| 4,965,660 | 10/1990 | Ogihara et al. | 357/81 |
| 4,993,482 | 2/1991 | Dolbear et al. | 165/80.2 |
| 5,006,924 | 4/1991 | Frankeny et al. | 357/82 |
| 5,022,462 | 6/1991 | Flint et al. | 165/80.4 |
| 5,057,903 | 10/1991 | Olla | 357/72 |
| 5,070,936 | 12/1991 | Carroll et al. | 165/80.4 |
| 5,083,194 | 1/1992 | Bartilson | 357/81 |
| 5,185,654 | 2/1993 | Mosher et al. | 257/659 |
| 5,218,759 | 6/1993 | Juskey et al. | 264/272.17 |
| 5,254,500 | 10/1993 | AuYeung | 437/214 |

FOREIGN PATENT DOCUMENTS

| | | | |
|---|---|---|---|
| 62-109326 | 5/1987 | Japan | 437/902 |
| 279451 | 3/1990 | Japan | 437/902 |

OTHER PUBLICATIONS

"Deltem TM Composite Heat Sinks Introduce A New Dimension to Electronics Heat Transfer", EG&G Wakefield Engineering, Product Brochure, Jun. 1989, pp. 1-4.

Microelectronics Packaging Handbook, New York, Van Nostrand Reinhold, 1989, p. 560, TK7874,T824 1988.

*Primary Examiner*—Olik Chaudhuri
*Assistant Examiner*—David E. Graybill
*Attorney, Agent, or Firm*—Fulbright & Jaworski

[57] ABSTRACT

A process for making thermosetting or thermoplastic encapsulated integrated circuit having a heat exchanger in which one end of the heat exchanger is encapsulated in the housing adjacent to the integrated circuit and the other end is exposed to the environment beyond the housing portion. The process of making includes molding a heat exchanger into a thermosetting or thermoplastic package utilizing a preformed heat exchanger having a dissolvable or removable material which serves as a seal block during the molding operation. A plurality of thermally conductive heat exchanger elements are provided for providing the desired thermal performance while reducing the thermal stresses in the package.

32 Claims, 5 Drawing Sheets

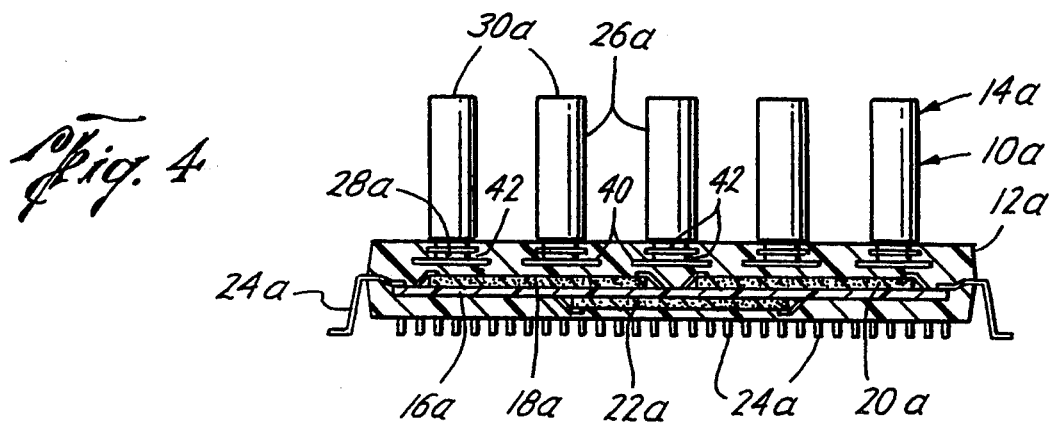
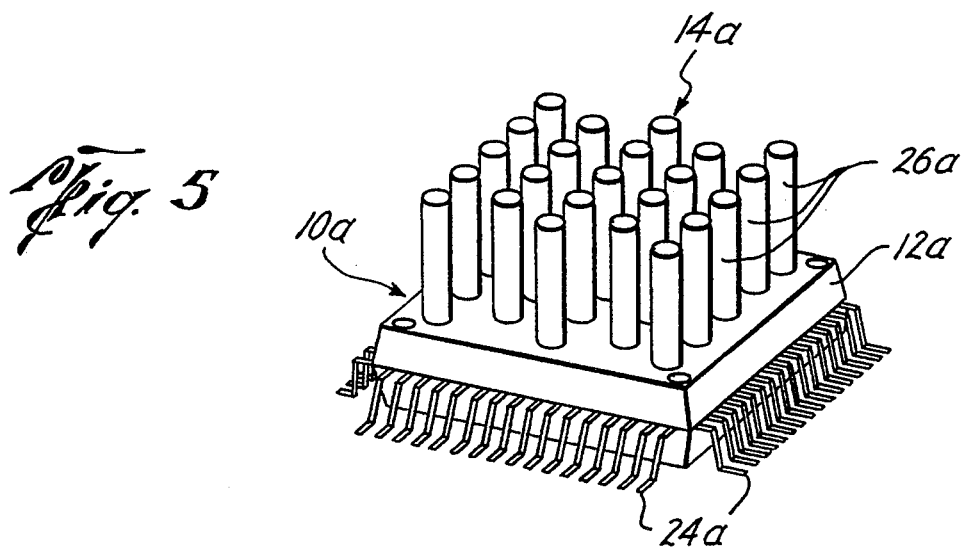
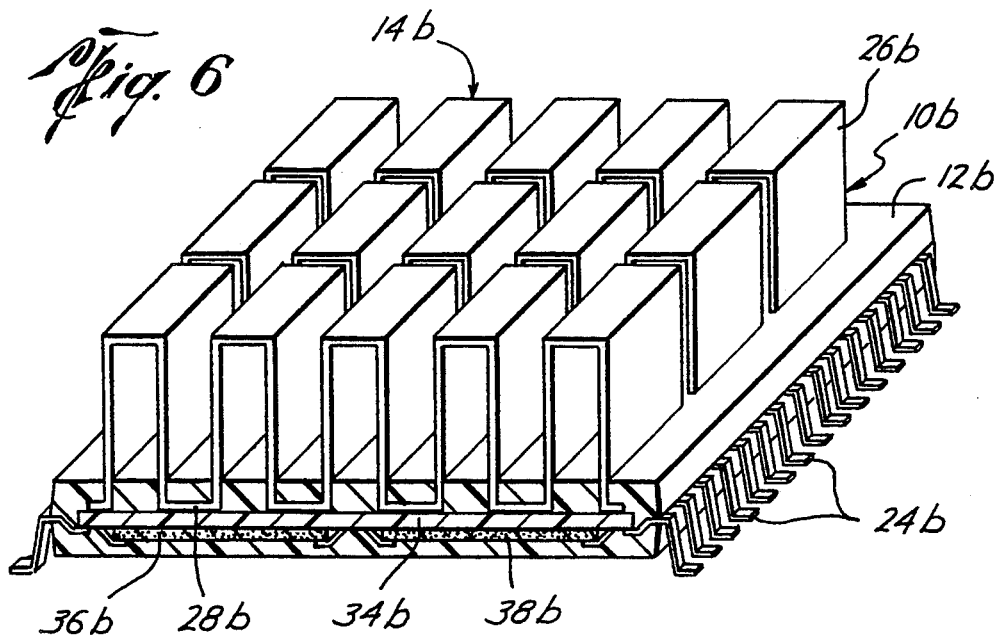

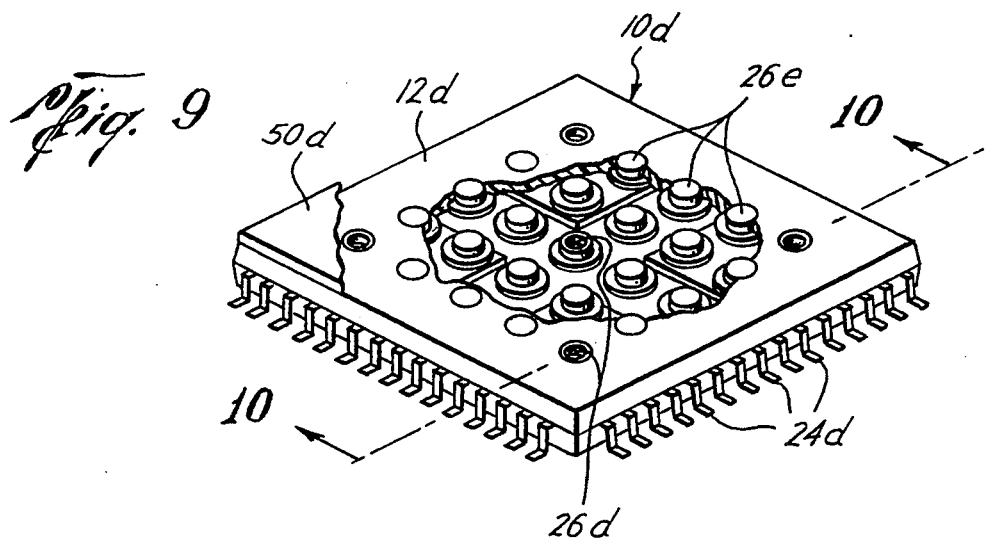
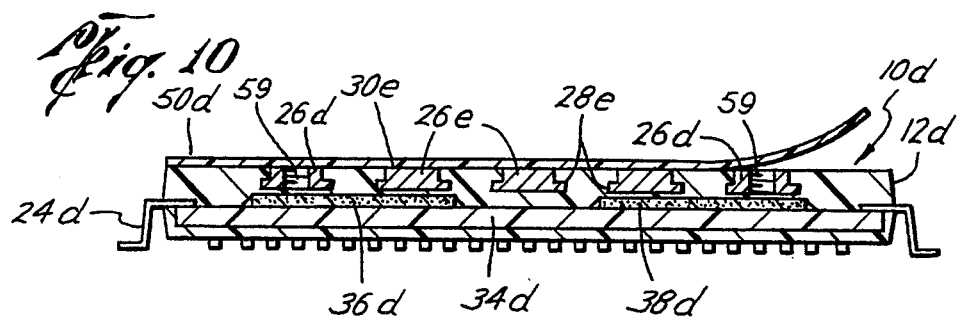
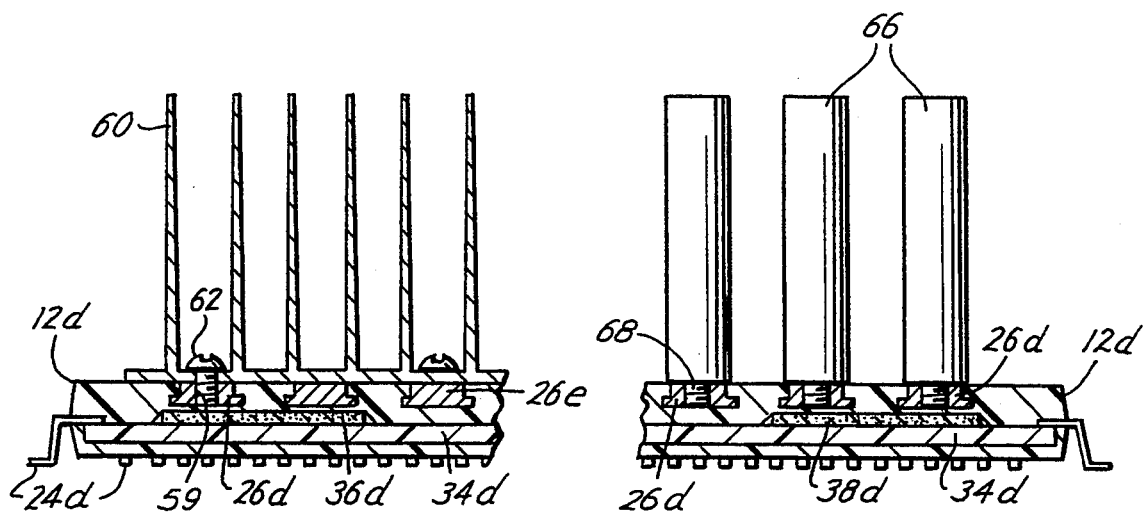

METHOD FOR ENCAPSULATING AN INTEGRATED CIRCUIT USING A REMOVABLE HEATSINK SUPPORT BLOCK

BACKGROUND OF THE INVENTION

The present invention is directed to an encapsulated plastic integrated circuit chip with a heat exchanger and the method of manufacture.

The packaging of single or multiple integrated circuit chips or die into conventional plastic packages is limited by the poor thermal conductivity of the molding material and the available surface area for cooling. Attachment of extended metal heat exchanger surfaces to the exterior of the package increases the surface area for convection. However, large area attachment is subject to high stresses due to the mismatch in thermal expansion between the plastic and the metal heat exchanger. Moreover, it adds a thermally resistive layer between the chips and the heat sink.

SUMMARY OF THE INVENTION

The present invention apparatus and method allows enlarging the area for heat transfer while avoiding the large area attachment problem. In addition, it offers nearly equal thermal performance at a lower cost than state of the art methods above due to the absence of metal slugs and the like and due to using a lower cost heat exchanger. In addition, the proposed structure and method allows the mounting of components on both sides of a substrate in a chip package while achieving this performance. The thermosetting or thermoplastic encapsulated package and method of making incorporates a plurality of individual heat exchange elements, such as a plurality of fins or pins into a single/few chip package as well as attaching such structures to multichip modules (MCMs). The method uses a dissolvable or removable support block which can be used during package molding or during the bonding process to position heat exchanger elements adjacent to the integrated circuit structure. This method eliminates the large area attachment problem.

An object of the present invention is to provide a low cost thermosetting or thermoplastic package which includes a heat exchanger molded directly into the package to improve the thermal performance by providing a heat flow path with higher thermal conductivity than the thermosetting or thermoplastic material. This provides a structure which is more reliable than attaching a heat sink directly to the package and provides a package that has cost/thermal performance benefits as compared to conventional plastic integrated circuit packages which utilize metal slugs molded into the package on which an extended heat exchanger may be attached.

Another object of the present invention is to provide an integrated circuit package which has sufficient thermal performance while allowing electrical components to be mounted on both sides of a substrate molded in the package.

A still further object of the present invention is to provide a method of molding a plurality of heat exchanger elements into a package by preforming, such as pre-molding or pre-casting, the heat exchange elements into a block of compliant, dissolvable or removable material to produce a seal block which allows the heat exchanger to be molded into the body of the package.

Still a further object is the provision of an encapsulated integrated circuit having a heat exchanger which includes an integrated circuit chip having a plurality of electrical leads electrically connected to the chip and a plurality of thermally conductive heat exchanger elements having first and second ends. The heat exchanger elements are spaced from each other and have their first ends positioned adjacent to the chip for receiving heat therefrom. A non-electrically conductive thermal thermosetting or thermoplastic material forms a housing enclosing the chip and the first ends of the heat exchanger elements. The electrical leads sealably extend through the material and the second ends of the heat exchanger elements are exposed to the exterior of the housing of the material for cooling. In one embodiment the heat exchanger elements include a plurality of parallel spaced fins having their first ends interconnected. In another embodiment the heat exchanger elements include a plurality of parallel extending and generally evenly spaced rows of metal pins. The first ends of the pins may include an enlarged head, and the pins may include interlocking grooves for locking the pins to the encapsulating material. In a third embodiment the heat exchanger elements may be fins having a corrugated cross-sectional shape. In a fourth embodiment the heat exchanger elements may include connecting means on the second ends of the heat exchanger elements for receiving heat exchanger extensions for increasing the thermal dissipation performance of the circuit.

Yet a still further object of the present invention is directed to a method of making an encapsulated integrated circuit having a heat exchanger which includes preforming a removable support block for supporting a plurality of spaced thermally conductive heat exchanger elements having first and second ends. The support block engages and supports the second ends of the elements while leaving the first ends exposed. The support block is inserted into a mold with the first ends positioned adjacent to an integrated circuit chip having a plurality of electrical leads connected thereto. A non-electrically conductive thermosetting or thermoplastic material is molded forming a housing enclosing the chip and the first ends of the heat exchanger elements but allowing the leads to sealably extend through the housing. This allows the second ends of the heat exchanger elements to be exposed to the exterior of the housing. The method further includes removing the support block from the second ends of the heat exchanger elements after the housing is formed.

A still further object is wherein the support block seals the second ends from the thermosetting or thermoplastic material during molding and the support block may be removed physically or by dissolving the block.

Still a further object is wherein the method includes attaching a heat exchanger extension to the second ends of at least some of the heat exchanger elements.

A feature of the present invention method is that during molding the support block seals the second ends from the encapsulant and thereby prevents the encapsulant from contacting the second ends. This is particularly advantageous since low viscosity epoxy under pressure can flow through very narrow cracks between the heat exchanger elements and the mold, for instance due to mismatched coefficients of thermal expansion or size tolerances, and entirely encompass the heat exchange elements.

Other and further objects, features and advantages will be apparent from the following description of presently preferred embodiments of the invention, given for the purpose of disclosure, and taken in conjunction with the accompanying drawings.

BRIEF DESCRIPTION OF THE DRAWINGS

FIG. 4 is an elevational view, in cross-section, of another embodiment of the present invention in which the heat exchanger is in the form of a plurality of rows of pins, FIG. 5 is an elevational view, in perspective, of the package of FIG. 4, FIG. 6 is an elevational perspective view, in cross-section, of another embodiment of the present invention utilizing a corrugated cross-sectional shaped type fin heat exchanger, FIG. 9 is an elevational perspective view, partly in cross-section, illustrating another embodiment of a heat exchanger and support block, FIG. 10 is a cross-sectional view taken along the line 10—10 of FIG. 9, FIG. 11A is a fragmentary cross-sectional view of the structure of FIG. 9 showing the attachment of fin type heat exchanger extensions, FIG. 11B is a fragmentary cross-sectional view of a structure similar to FIG. 9 using pin type heat exchanger extensions.

DESCRIPTION OF THE PREFERRED EMBODIMENTS

Figure 1:
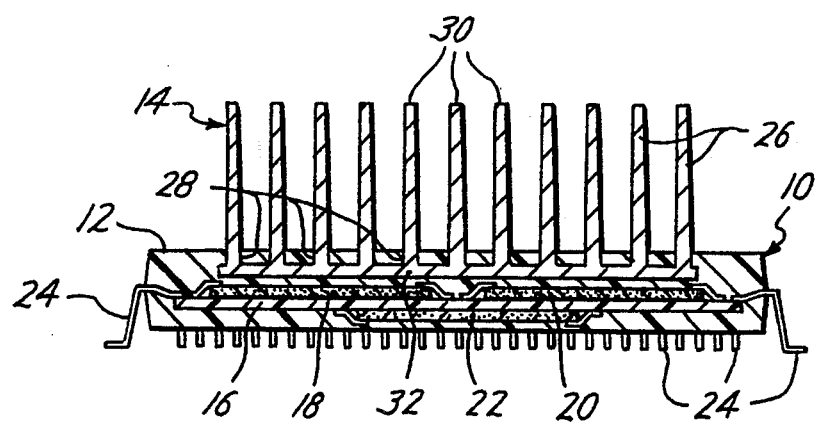
FIG. 1 is an elevational view, in cross-section, of a finned type heat exchanger and a thermosetting or thermoplastic encapsulated package having a substrate with integrated circuit chips on both sides.
Figure 2:
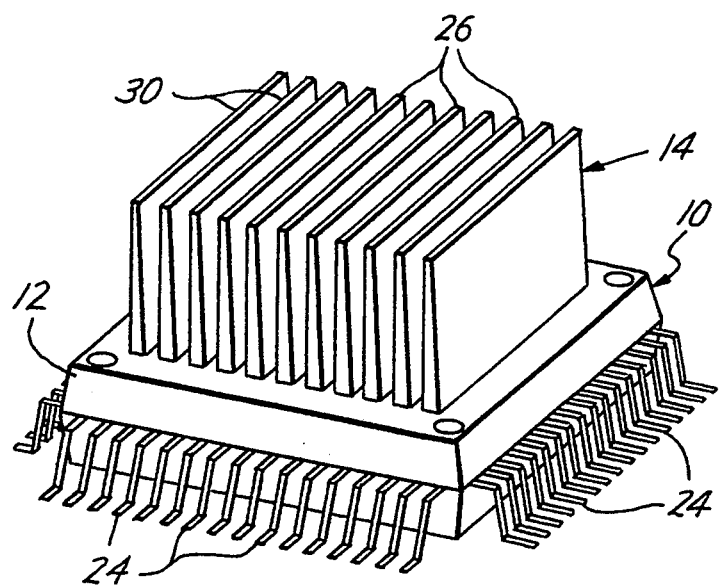
FIG. 2 is an elevational perspective view of the package of FIG. 1.

Referring now to the drawings, particularly to FIGS. 1 and 2, the reference 10 generally indicates the encapsulated integrated circuit package of the present invention having an integrated circuit structure, a thermosetting or thermoplastic housing 12 and a heat exchanger generally indicated by the reference numeral 14.

The integrated circuit structure may take various forms, the simplest being a single integrated circuit chip (FIG. 7), but the present invention package and method are useful for few chip packages as well as multi-chip modules. For example only, the integrated structure shown in FIG. 1 includes a substrate 16 having integrated circuit chips or dice 18, 20, and 22 on opposite sides of the substrate 16. Electrical leads 24 are electrically connected to the chips 18, 20, and 22 either directly or, as shown, indirectly through the substrate 16.

The heat exchanger 14 includes a plurality of thermally conductive heat exchanger elements 26, such as fins, which are spaced from each other. Any suitable material may be used such as aluminum, other metals, and graphite. The fins 26 have first ends 28 and second ends 30. The first ends 28 are positioned adjacent to the integrated circuit chips 18, 20 and 22 and substrate 16 for receiving heat therefrom and, if desired, the first ends 28 may be interconnected by a base 32.

The housing is a non-electrically conductive thermosetting or thermoplastic material forming the housing which encloses the substrate 16, the chips 18, 20 and 22 and the first ends 28 of the heat exchanger elements 26 and the base 32. Plastic is a preferred housing. The electrical leads 24 sealingly extend through the material and the second ends 30 of the heat exchanger elements 26 are exposed to the exterior of the housing for conducting heat from the integrated circuit structure to the surrounding environment. The thermosetting or thermoplastic material 12 may be of any suitable material including epoxies such as anhydride epoxy, novolak epoxy and polyimide epoxy, polyphenylene sulfide, polyetherimide, polyethersulfone, or liquid crystal polymers. The package 10 may for instance provide a low cost enclosure, such as a plastic package, having a heat exchanger in part molded directly into the housing 12 to improve the thermal performance and includes a plurality of spaced heat exchanger elements 26 connected thereto extending out of the housing 12 thereby providing a heat exchanger 14 with high thermal conductivity and with low mechanical stresses in the package 12.

Figure 3:
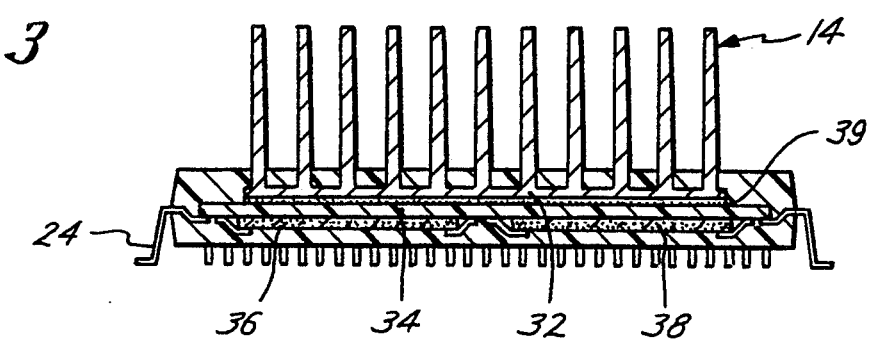
FIG. 3 is an elevational view, in cross-section, of a finned heat exchanger similar to that shown in FIG. 1, but in an encapsulated package having a substrate in contact with or bonded to the heat exchanger.

The embodiment shown in FIGS. 1 and 2 illustrates the use of a package 10 having a heat exchanger 14 allowing electrical chips 18, 20 and 22 to be mounted on both sides of the substrate 16 and molded in the package 10. However, the integrated circuit structure may be varied. Referring to FIG. 3, the heat exchanger 14 has its base 32 molded in the housing 12 with the substrate 34 inverted and the chips 36 and 38 therebelow thereby allowing the heat exchanger 14 to be positioned against the substrate 34 on the side opposite the chips. Adhesive 39, for instance, may be sandwiched between heat exchanger 14 and substrate 34. This provides a low cost package with improved performance due to the thinner bond line between the substrate 34 and the heat exchanger base 32. Other arrangements of the integrated circuit structure may be provided such as applying the heat exchanger 14 directly to the back sides of flip-chip attached integrated circuit chips.

Other and further embodiments may be provided as will be more fully described hereinafter wherein like parts to those used in FIGS. 1 and 2 will be similarly numbered with the addition of separate suffixes.

Referring now to FIGS. 4 and 5, another embodiment of a thermosetting or thermoplastic encapsulated integrated circuit package 10a is best seen in which the heat exchanger elements 26a in the heat exchanger 14a consists of pin shaped elements. The elements 26a include a plurality of parallel extending and generally evenly spaced rows of metal pins 26a which have several advantages. First, pins 26a, as distinguished from the fins, are omnidirectional both in forced and natural convection cooling environments. Secondly, the individual elements 26a are preferably not interconnected and thus provide a lower thermo-mechanical stress where temperature changes occur in the package 10a. Preferably, the first ends 28a of the elements 26a each include an enlarged head 40 and one or more interlock grooves 42. The enlarged head 40 serves to provide a high conductivity path for heat to flow from the integrated circuit structure to pins 26a. This will avoid a large temperature rise in the housing 12a due to heat flow constriction in the low conductivity housing 12a. In addition, the grooves 42 on the first ends 28a of the pins 26a provide an interlocking feature for more securely mechanically interlocking the first ends 28a of the pins 26a in the housing 12a. The isolated nature of the individual pins 26a reduces the propensity for cracking of the molding housing 12a due to stress on cool down from molding or during temperature changes.

Referring now to FIG. 6, a further embodiment is illustrated in which the package 10b includes a heat exchanger 14b having its first ends 28b positioned adjacent to a substrate 34b with integrated circuits 36b and 38b connected to the backside of the substrate 34b. In this embodiment the heat exchanger 14b includes a plurality of heat exchanger elements 26b which are parallel spaced rows of spaced fins which are corrugated shaped in cross-section. The corrugated shape provides good heat transfer and the short first ends 28a relieve or limit mechanical stress. The corrugated shape also allows getting more dense fin arrays which results in better heat transfer relative to conventional aluminum extrusions.

Figure 7:
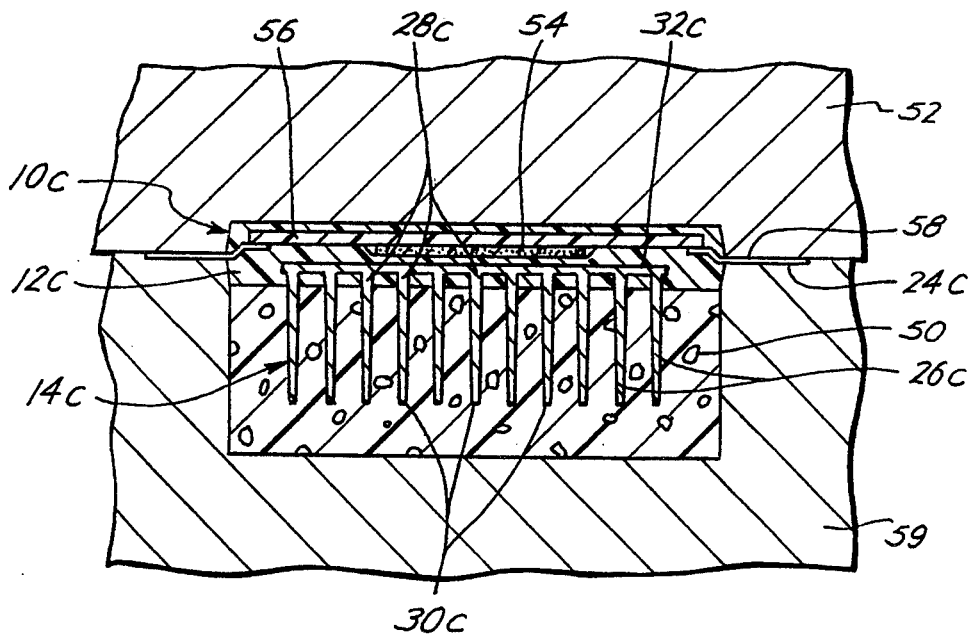
FIG. 7 is a fragmentary elevational view, in cross-section, illustrating the method of using a preformed support block in a mold for molding in a package.

The method of making a thermosetting or thermoplastic encapsulated integrated circuit having a heat exchanger is best seen by referring to FIG. 7. First, the method includes preforming a removable seal and support block 50 for supporting a heat exchanger 14c comprising a plurality of spaced thermally conductive heat exchanger elements 26c, here shown as fins, although other types such as pins and corrugated shapes may be used. The heat exchanger elements 26c are preformed in the block 50 such as being pre-molded or pre-cast into the support block 50 which consists of a compliant removable or dissolvable material such as nylon, polyurethane, styrene, either rigid or foam. The support block 50 engages and supports the second ends 30c of the heat exchange elements 26c while leaving the first ends 28c and a base 32c, if desired, exposed. Then, the support block 50 along with the supported heat exchanger 14c is inserted into a mold 52, its position in the mold 52 depending upon the configuration of the encapsulated package. In the example given in FIG. 7, the base 32c is positioned against and/or adjacent to an integrated circuit chip 54 positioned on a substrate 56 which is mounted on a leadframe 58. In this example the seal block 50 and supported heat exchanger 14c are inserted into the lower mold cavity 59 prior to the leadframe 58 placement. The encapsulated package 10c is then molded upside down. In other cases, the seal and support block 50 and heat exchanger 14c may be inserted into the upper mold cavity. The housing 12c is then molded into the mold 52 surrounding the substrate 56, the integrated circuit chip 54, the leadframe 58 with the leads 24c extending therefrom and enclosing the base 32c and the first ends 28c of the heat exchanger elements 26c.

In the molding process the support block 50 acts as a seal to prevent the encapsulant from enclosing the second ends 30c of the heat exchanger elements 26c or from attaching elements 26c to the mold. This is significant because it would be difficult if not impossible to provide a mold which could adequately seal elements 26c. Several reasons may account for this, including a mismatch of thermal coefficients of expansion between the mold and elements 26c, the tolerances of the mold and elements 26c, and the ability of low viscosity epoxy under pressure to flow through cracks less than 0.0002 inches in cross-section between the mold and the elements 26c. If for any of these reasons the encapsulant were to flow through the seal then it quite possibly would surround the second ends 28c and consequently interfere with thermal performance as well as lock in surface imperfections. An acceptable seal could be provided by using extremely tight tolerances on both the mold and the elements, but this would not be practical or cost effective.

Figure 8:
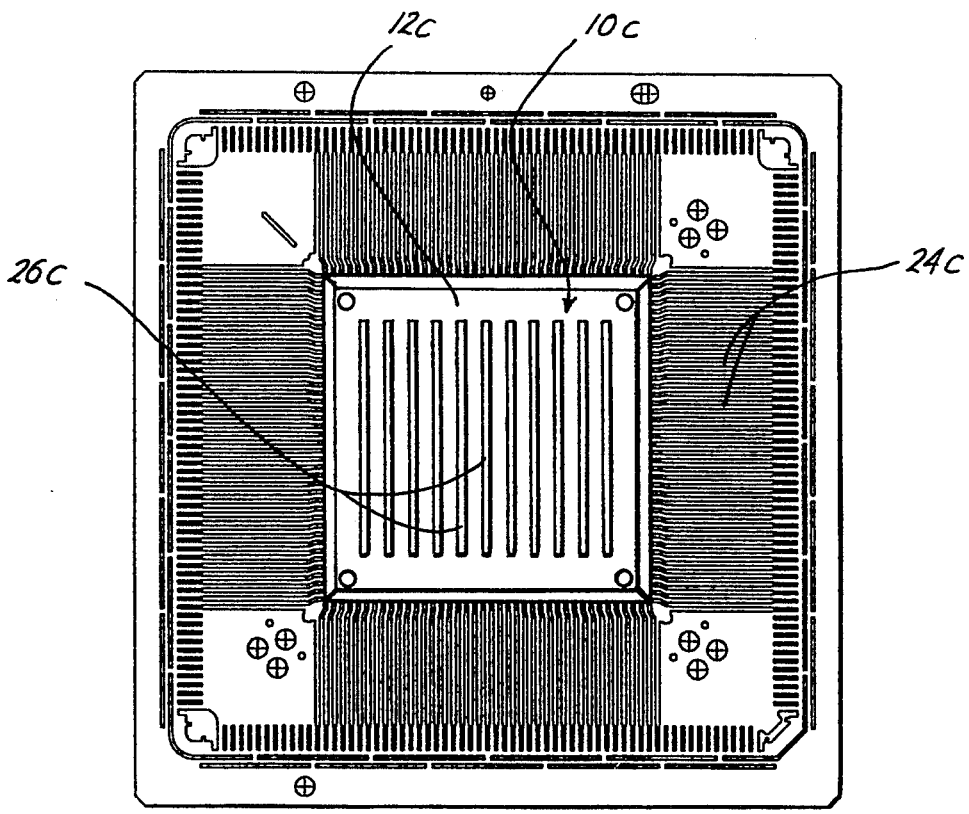
FIG. 8 is an enlarged top plan view of the package of FIG. 7 with the support block removed and the leadframe in place prior to trimming and forming.

Returning to the process, after molding, the encapsulated package 10c is removed from the mold 52 along with the support block 50. The support block 50 is then removed from the second ends 30c of the heat exchanger elements 26c physically or by being dissolved in a suitable solvent such as methylene chloride. FIG. 8 shows a top plan view of the encapsulated package 10c prior to trimming and forming the extending leads 24c. The fin type heat exchanger elements 26c thus extend outwardly from the housing 12c.

Referring now to FIGS. 9 and 10, a still further embodiment of the encapsulated thermosetting or thermoplastic integrated circuit chip with a heat exchanger is best seen. In this embodiment the heat exchanger may consist of a plurality of short pins 26d and/or 26e. The pins 26d include threaded openings 59 for receiving a heat exchanger extension as will be more fully described hereinafter whereas pins 26e do not contain threaded openings. In this embodiment the seal and support block 50d include a peelable backing having a high temperature adhesive such as polyimide, epoxy or Kapton tape. Thus, in manufacture, the heat exchanger elements 26d and 26e are attached to the peelable backing support block 50d at second ends 30d and 30e, respectively, so that the first ends 28d and 28e, respectively, are positioned adjacent to the integrated circuit chips 36d and 38d and the substrate 34d. The housing 12d is molded around the substrate 34d, the integrated circuit chips 36d and 38d and the heat exchange elements 26d and 26e, but the peelable backing 50d prevents the second ends 30d and 30e from being encapsulated in plastic. After molding, the peelable support block 50d is removed leaving the second ends exposed outside of the housing 12d. The embodiment 10d of FIGS. 9 and 10 with second ends 30d and 30e of the elements 26d and 26e, respectively, flush with the housing 12d are particularly useful in that existing pickup and place machines can easily handle the completed package 10d.

The exposure of the second ends 30d and 30e of the heat exchange elements 26d and 26e may be sufficient for cooling purposes. If desired, additional heat exchange extensions may be added to provide an extended cooling surface. Thus, in FIG. 11A a heat exchange extension 60 is attached to and in contact with the heat exchange elements 26d and/or 26e by threadably attaching the extension 60 to the threads 59 by screws 62. The heat exchanger extension 60 as best seen in FIG. 11A is of the fin type although it could also be of the corrugated type. If individual pin extensions 66 are desired, as best seen in FIG. 11B, then all of the heat exchanger elements would be of the type 26d and the extensions 66 would include threaded screws 68 for attachment into threaded openings 59 in each of the heat exchanger elements 26d.

Figure 12:
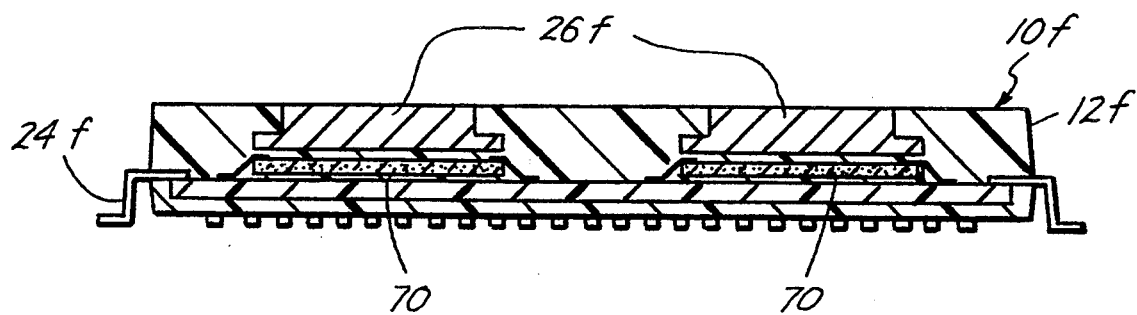
FIG. 12 is a cross-sectional view of the another embodiment of the present invention illustrating individual heat exchanger elements aligned with and adjacent to each integrated circuit chip in one-to-one relationship.

Finally, as seen in FIG. 12, the present invention may also make use of individual heat exchanger elements 26f aligned with and adjacent to each integrated circuit chip 70 in one-to-one relationship.

The present invention, therefore, is well adapted to carry out the objects and attain the ends and advantages mentioned as well as others apparent therein. While presently preferred embodiments of the invention have been given for the purpose of disclosure, numerous changes in the details of construction, arrangement of parts, and steps of the method of manufacture, will be readily apparent to those skilled in the art and which are encompassed within the spirit of the invention and the scope of the appended claims.

What is claimed is:

1. A method of making an encapsulated integrated circuit chip having a heat exchanger, comprising,
   providing an integrated circuit structure which includes an integrated circuit chip on a substrate, the chip electrically connected to a plurality of leads extending from the substrate;
   preforming a removable seal and support block supporting a plurality of spaced thermally conductive heat exchanger elements having first and second ends, said support block engaging and supporting the second ends of the heat exchanger elements while leaving the first ends exposed;
   inserting the support block in a mold cavity such that the support block is spaced from the integrated circuit structure and the first ends of the heat exchanger elements are positioned adjacent to the integrated circuit structure;
   molding a non-electrically conductive thermosetting or thermoplastic material to form a housing in the mold cavity enclosing the chip and the first ends of the heat exchanger elements while allowing the second ends of the heat exchanger elements to be exposed to the exterior of the housing; and
   removing the support block from the second ends of the heat exchanger elements.

2. The method of claim 1 wherein the support block is removed by dissolving the block in a solvent.

3. The method of claim 1 wherein the support block is selected from the group consisting of nylon, polyurethane and styrene.

4. The method of claim 1 wherein the heat exchanger elements are a plurality of spaced parallel fins with their first ends interconnected.

5. The method of claim 1 wherein the heat exchanger elements include a plurality of parallel extending and generally evenly spaced rows of pins supported by the support block.

6. The method of claim 5 wherein the first ends of the pins include an enlarged head for increased heat dissipation.

7. The method of claim 1 wherein the support is a peel-off backing Sheet-releasably secured by adhesive to the second ends of the heat exchanger elements, 8. The method of claim 1 including attaching a heat exchanger extension to the second ends of at least some of the heat exchanger elements.

9. The method of claim 1 wherein the support block seals the second ends from the thermosetting or thermoplastic material during molding and thereby prevents the material from encapsulating the second ends.

10. The method of claim 1 wherein the preforming is by pre-molding.

11. The method of claim 1 wherein the preforming is by pre-casting.

12. The method of claim 1 wherein the heat exchanger elements are selected from the group consisting of aluminum and graphite.

13. The method of claim 1 wherein the heat exchanger elements are a metal.

14. The method of claim 1 wherein the thermosetting or thermoplastic material is selected from the group consisting of epoxy, polyphenylene sulfide, polyetherimide, polyethersulfone, or liquid crystal polymers.

15. The method of claim 14 wherein the epoxy is selected from the group consisting of anhydride epoxy, novolak epoxy and polyimide epoxy.

16. The method of claim 1 wherein the thermosetting or thermoplastic material is a plastic.

17. The method of claim 1 wherein the first ends of the heat exchanger elements are positioned adjacent the integrated circuit chip.

18. The method of claim 1 wherein the first ends of the heat exchanger elements are positioned adjacent a side of the substrate opposite the integrated circuit chip.

19. The method of claim 1 wherein the first ends of the heat exchanger elements are spaced from the integrated circuit structure.

20. The method of claim 1 wherein the first ends of the heat exchanger elements are in contact with the integrated circuit structure.

21. The method of claim 1 wherein the second ends of the heat exchanger elements are inserted within the support block before molding occurs.

22. The method of claim 1 wherein the second ends of the heat exchanger elements extend from the exterior of the housing.

23. The method of claim 1 wherein the heat exchanger elements are electrically isolated from the integrated circuit chip.

24. The method of claim 1 wherein portions of the housing are disposed between the integrated circuit structure and the heat exchanger elements.

25. The method of claim 1 wherein portions of the housing are disposed between the heat exchanger elements.

26. The method of claim 1 wherein the heat exchanger elements are selected from the group consisting of aluminum and graphite.

27. The method of claim 1 wherein the heat exchanger elements are a metal.

28. The method of claim 1 wherein the heat exchanger elements are attached to the integrated circuit structure before molding occurs.

29. The method of claim 1 wherein the heat exchanger elements are not attached to the integrated structure before molding occurs.

30. The method of claim 1 wherein the heat exchanger elements are attached to the integrated circuit structure solely by the housing.

31. The method of claim 1 wherein the housing extends beyond all surfaces of the integrated circuit structure.

32. The method of claim 1 including allowing the leads to sealably extend through the housing.

* * * * *